(12) United States Patent
Osato

(10) Patent No.: US 7,833,036 B2
(45) Date of Patent: Nov. 16, 2010

(54) ELECTRICAL CONNECTING APPARATUS

(75) Inventor: Eichi Osato, Tokyo (JP)

(73) Assignee: Kabushiki Kaisha Nihon Micronics, Tokyo (JP)

( * ) Notice: Subject to any disclaimer, the term of this patent is extended or adjusted under 35 U.S.C. 154(b) by 299 days.

(21) Appl. No.: 12/088,238

(22) PCT Filed: Oct. 31, 2005

(86) PCT No.: PCT/JP2005/020331

§ 371 (c)(1),
(2), (4) Date: Mar. 26, 2008

(87) PCT Pub. No.: WO2007/052358

PCT Pub. Date: May 10, 2007

(65) Prior Publication Data

US 2010/0062662 A1    Mar. 11, 2010

(51) Int. Cl.
*H01R 13/62* (2006.01)
(52) U.S. Cl. ....................................................... 439/264
(58) Field of Classification Search ................... 439/66, 439/71, 264, 330, 525–526
See application file for complete search history.

(56) References Cited

U.S. PATENT DOCUMENTS 6,350,153 B1    2/2002   Lee
6,884,087 B2 *  4/2005   Searls et al. ................... 439/66

FOREIGN PATENT DOCUMENTS

| JP | 08-233900   | 9/1996  |
|----|-------------|---------|
| JP | 11-295384   | 10/1999 |
| JP | 2001-338740 | 7/2001  |
| JP | 2001-250600 | 9/2001  |
| JP | 2003-185700 | 7/2003  |
| JP | 2004-047188 | 2/2004  |
| JP | 2004-061390 | 2/2004  |
| JP | 2005-069805 | 3/2005  |

* cited by examiner

*Primary Examiner*—Khiem Nguyen
(74) *Attorney, Agent, or Firm*—Stolowitz Ford Cowger LLP

(57) ABSTRACT

An electrically connecting apparatus comprises a base member provided with slots penetrating in the plate thickness direction, contacts disposed within the slots so as to be able to contact electrodes of a device under test on the base member and for connecting the electrodes to an electric circuit of a tester, and an elastic member. The contacts has a fixed piece to be fixedly held on the base member within the slots for connection with the electric circuit, and a movable piece disposed within the slots for electrical connection with the fixed piece. In the fixed piece, a guide face for guiding the movable piece toward a contact position permitting the movable piece and the electrodes to contact is formed, and the movable piece is supported slidably on the guide face so as to receive elastic biasing force toward the contact position by the elastic member.

19 Claims, 8 Drawing Sheets

ELECTRICAL CONNECTING APPARATUS

RELATED APPLICATIONS

This application is a national phase application and claims priority to pending international application Ser. No. PCT/JP2005/020331, filed Oct. 31, 2005.

TECHNICAL FIELD

The present invention relates to an electrical connecting apparatus suitable for use as auxiliary means in an electric test of a semiconductor device such as an integrated circuit.

BACKGROUND ART

In a test of electric characteristics of an integrated circuit (IC) sealed by a package, a mold and the like, is generally used auxiliary means for testing comprising an electrical connecting apparatus called socket. Each electrode of a semiconductor device as a device under test is movably connected to an electric circuit of a testing apparatus such as a tester through this electrical connecting apparatus. This type of electrical connecting apparatus is described in Patent Document 1.

Patent Document 1: Japanese Patent Appln. Public Disclosure No. 8-233900 Official Gazette The electrical connecting apparatus described in Patent Document 1 comprises a plate-like electrically insulating housing with a plurality of slots penetrating in a plate thickness direction, and a device under test (DUT) board, on which a circuit to be connected to a tester is formed, is attached to the underside of the housing. Also, on the upside of the housing, a semiconductor device to be tested is disposed so that a lead as its electrode may extend toward each slot. Each contact is made of a conductive contact base member and a conductive contact member. The contact, disposed in each slot, is slidable on a guide face of the contact base member. Each contact base member is elastically supported within the slot of the housing so as to be pressed toward the circuit on the board provided on the underside of the housing by the elastic biasing force of two elastic members traversing each slot. Also, both the elastic members exert their elastic biasing force to each conductive contact member. Each conductive contact member is disposed within the housing slidably on the guide face of the corresponding contact base member and is disposed in the housing with its contact end portion projected from the upside of the housing.

Consequently, by pressing the lead of the semiconductor device against the conductive contact member of each corresponding contact, each lead is connected to the corresponding circuit on the board through the contact base member on which the conductive contact member slides, which enables testing by the tester.

In the heretofore electrical connecting apparatus, however, the conductive contact base member and the conductive contact member guided to slide by the conductive contact base member are elastically supported on the housing by the above-mentioned two elastic members. For this reason, when the lead of the semiconductor device is pressed against the conductive contact member for a test, a contact end of the conductive contact member to the lead slides on the lead with the sliding of the conductive contact member. At this time, the conductive contact base member slidably receiving the conductive contact member on the guide face also slides slightly on the circuit of the board.

When the contact end of the conductive contact member slides on the lead, the lead surface is sometimes slightly scraped. However, this is only once at the time of testing and does not cause the lead to have any great damage or abrasion. Moreover, since the oxide film on the lead surface is removed by the sliding, electrical connection between the lead and the contact end of the conductive contact member is ensured, so that this sliding is desirable.

On the other hand, when the conductive contact base member slides on the circuit of the board, the circuit portion is subjected to slight abrasion. However, the board, different from the electrode of the semiconductor device to be tested, is subjected to repeated sliding of the conductive contact base member every time a new semiconductor device is tested. Consequently, the conductive contact base member and the circuit portion of the board on which the conductive contact base member slides are prone to be worn, thereby causing to spoil durability.

DISCLOSURE OF THE INVENTION

Problems to be Solved by the Invention

It is, therefore, an object of the present invention to provide an electrical connecting apparatus excellent in durability in comparison with a conventional one.

Means to Solve Problems

The present invention relates to an electrical connecting apparatus for connecting the electrode of a device under test to an electric circuit of a tester, and comprises: an electrically insulating plate-like base member for receiving the device under test having slots penetrating in its plate thickness direction; contacts disposed within the slots so as to contact the electrode of the device under test on the base member and for connecting the electrode to the electric circuit of the tester; and an elastic member. The contact has a fixed piece to be fixedly held within the slots on the base member for connection to the electric circuit; and a movable piece disposed within the slots and electrically connected to the fixed piece. In the fixed piece, a guide face for guiding the movable piece to a contact position to permit contact between the movable piece and the electrode is formed. The movable piece is supported by the elastic member to slide on the guide face so as to receive elastic biasing force toward the contact position.

It is possible to fix a wiring base plate on one face of the base member and to receive the device under test on the other face side of the base member. A wiring portion which is connected to the electric circuit of the tester and with which the fixed piece is brought into contact is formed on the wiring base plate, and the fixed piece is electrically connected to the electric circuit through the wiring portion.

The movable piece may have a projected portion which can project from within the slot over the other face of the base member.

The fixed piece can be engaged with a peripheral wall of the slot of the base member by an engaging mechanism.

The engaging mechanism can be constituted by a projection formed on the peripheral wall of the slot and a recess formed in the fixed piece for engagement with the projection.

The guide face can be formed angularly with respect to the center line penetrating openings of both ends of the slot. When the movable piece slides along the guide face, an amount of displacement of a Z-axial direction component along the center line can be greater than the amount of displacement of the movable piece along an X-axial direction which is the longitudinal direction of the slot as viewed by a planar shape of the slot orthogonal to the center line.

The guide face can be a straight guide face extending angularly with respect to the center line of the slot.

The fixed piece may have: a bottom portion disposed along one of the faces of the base member within the slot and along the longitudinal direction of the slot; a first upright portion closer to the other face of the base member from one corner portion of the bottom portion longitudinally of the slot; and a second upright portion raised along the first upright portion at an interval from the other side of the bottom portion and terminates at a lower height position than that of the first upright portion. In this case, the guide face is formed on the face of the first upright portion confronting the second upright portion. The movable piece receives the elastic biasing force of the elastic member between both the upright portions so as to abut the guide face.

In correspondence to the array of electrodes of a device under test, a plurality of the slots can be formed in alignment in their width directions. In each slot, contacts each including the movable piece and the fixed piece are disposed in alignment, and a single elastic member is disposed across the aligned slots in the width direction of the slots so as to exert the elastic biasing force to each movable piece within the aligned plural slots.

The contact can be a Kelvin connector contact made of a laminated structure provided with a pair of conductive layers and an electrically insulating layer between the conductive layers.

Effect of the Invention

In the electrical connecting apparatus according to the present invention, since the fixed piece for slidably guiding the movable piece of the contact is fixedly held on the base member within the slot, the fixed piece does not slide with the sliding of the movable piece every time the movable piece slides, thereby preventing lowering of durability due to abrasion accompanying the sliding of the fixed piece.

Also, the fixed piece being fixedly held on the base member, if a wiring base plate in contact with the wiring portion of this wiring base plate is provided in the base member, the fixed piece contacting the wiring portion of the wiring base plate is prevented from sliding at every inspection on the wiring portion, thereby surely preventing the fixed piece and the wiring portion from wearing by sliding and thereby improving the durability.

By forming the projected portion in the movable piece, the front end of the projected portion projecting from the inside of the slot at the contacting position can be surely brought into contact with the electrode.

By employing an engaging mechanism in combining the fixed piece and the base member, the fixed piece can be surely and easily coupled with the base member fixedly.

By forming the above-mentioned engaging mechanism with the projection in the peripheral wall of the slot and the recess in the fixed piece, it is possible to insert the fixed piece into the slot so as to avoid the projection and to engage the recess of the fixed piece with the projection of the slot at a position where the recess of the fixed piece corresponds to the projection of the slot wall, thereby combining both of them more surely and easily, and realizing more efficient assembling work.

By making the amount of displacement of the X-axial component of the movable piece greater than the amount of displacement of the X-axial component, the moving distance of the movable piece sliding on the electrode face of the device under test can be set smaller when the electrode of the device under test is pressed against the movable piece of the corresponding contact. Since this can prevent the contact from deviating from the electrode due to a great displacement of the movable piece, this favorable for an electrical test of a miniaturized semiconductive device provided with a smaller sized electrode.

By making the guide face a straight guide face as mentioned, a favorable guide face can be easily and accurately formed without causing any great error.

Compact contacts with a relatively simple structure and an electrical connecting apparatus having the contacts are realizable, by providing first and second upright portions apart from each other and rising from the bottom portion of the fixed piece, by forming a guide face of the movable piece relative to the first upright portion and by disposing the elastic member relative to both upright portions.

Also, elastic biasing force appropriate for action of a plurality of contacts can be applied so that a favorable electrical connection can be obtained by the elastic biasing force of a single elastic member, by disposing a single elastic member traversing a row of the slots at each slot row. Thus, there is no need to provide two elastic bodies as heretofore in each slot row, thereby simplifying the constitution.

Also, by employing a Kelvin connector contact made of a laminated structure as a contact, influence by contact resistance of the contact is reduced, so that it becomes possible to measure even a device under test having a low resistance value at a high accuracy.

Figure 1:
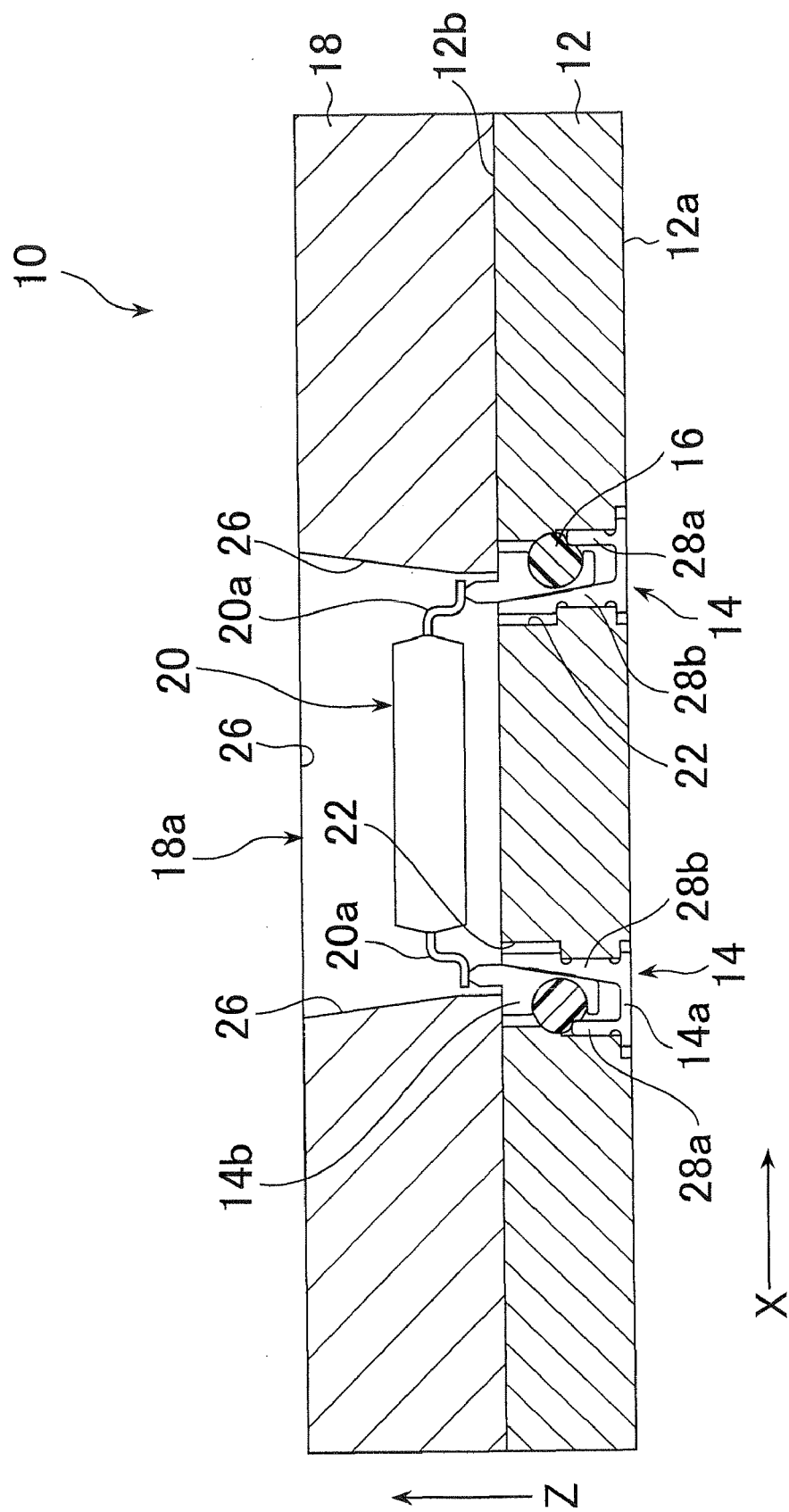
FIG. 1 is a cross-sectional view of the electrical connecting apparatus according to the present invention.

EXPLANATION OF REFERENCE NUMERALS 10 electrical connecting apparatus
12 base member
14, 114 contact
14a, 114a fixed piece
14b, 114b movable piece
16 elastic member
20 device under test (semiconductor IC)
20a electrode (lead)
22 slot
28a, 128a bottom portion of fixed piece
28b, 128b first upright portion of fixed piece
28c, 128c second upright portion of fixed piece
32b, 132b guide face (straight inclined guide face)
36, 136 recess of engaging mechanism 38 projection of engaging mechanism
46, 146 projection of movable piece
48 wiring base plate
48a wiring portion of wiring base plate
50 tester

BEST MODE FOR CARRYING OUT THE INVENTION

As shown in FIG. 1 representing a vertical section, the electrical connecting apparatus 10 according to the present invention comprises: a base member 12; a plurality of contacts 14 called probes to be incorporated into the base member; at least one rod-like elastic member 16 having a circular cross sectional shape for applying elastic biasing force to the plural contacts 14; and a plate-like cover member 18 to be removably attached to the base member 12 through bolts (not shown). The elastic members 12 can be made of a synthetic rubber such as silicon gum or urethane rubber.

Figure 2:
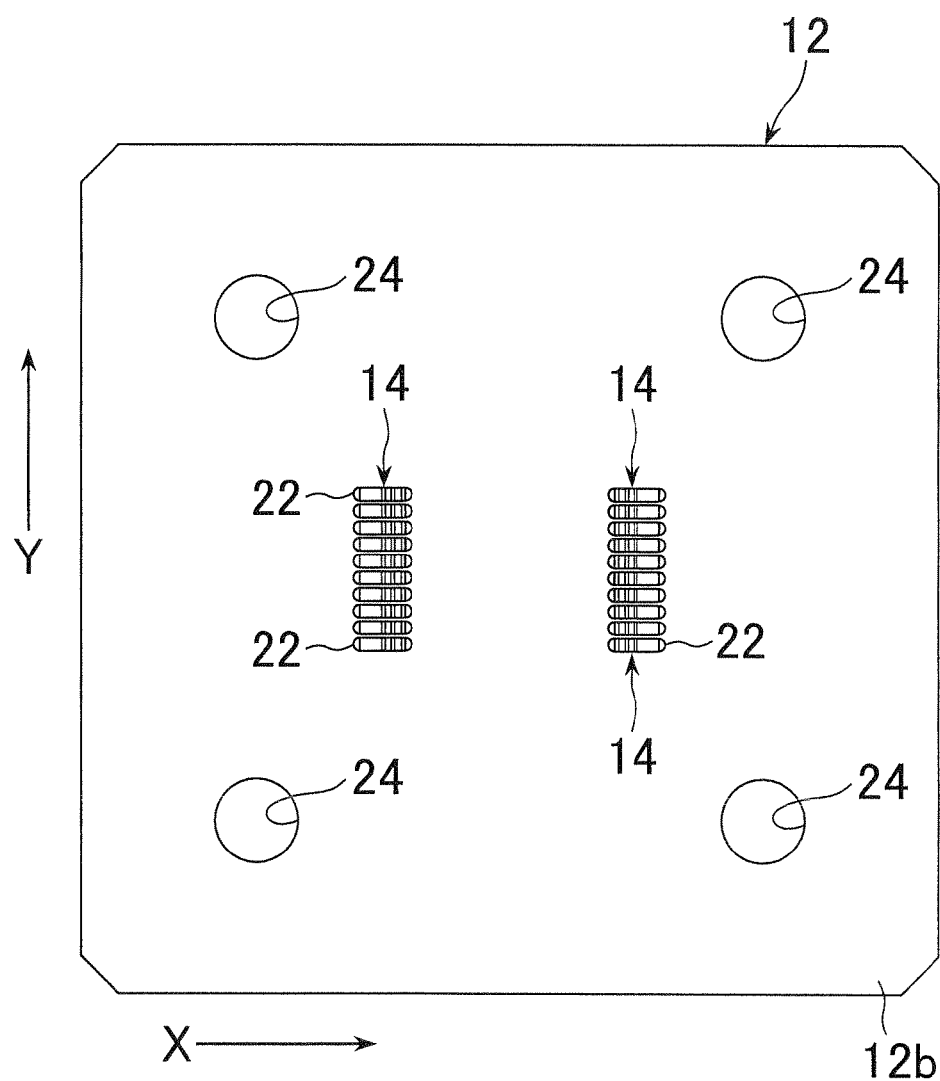
FIG. 2 is a plan view showing a base member with a cover of the electrical connecting apparatus in FIG. 1 removed.

FIG. 2 is a top view of the base member 12 with the cover member 18 removed. As shown in FIG. 2, the base member 12 is made of a plate-like non-conductive material and has a rectangular planar shape. In the central area of the base member 12, a plurality of slots 22 corresponding to respective electrodes of a semiconductor IC 20 which is the device under test shown in FIG. 1, namely, leads 20a are aligned. Each slot 22 is formed to penetrate from the bottom face 12a of the base member 12 through the upper face 12b.

Figure 3:
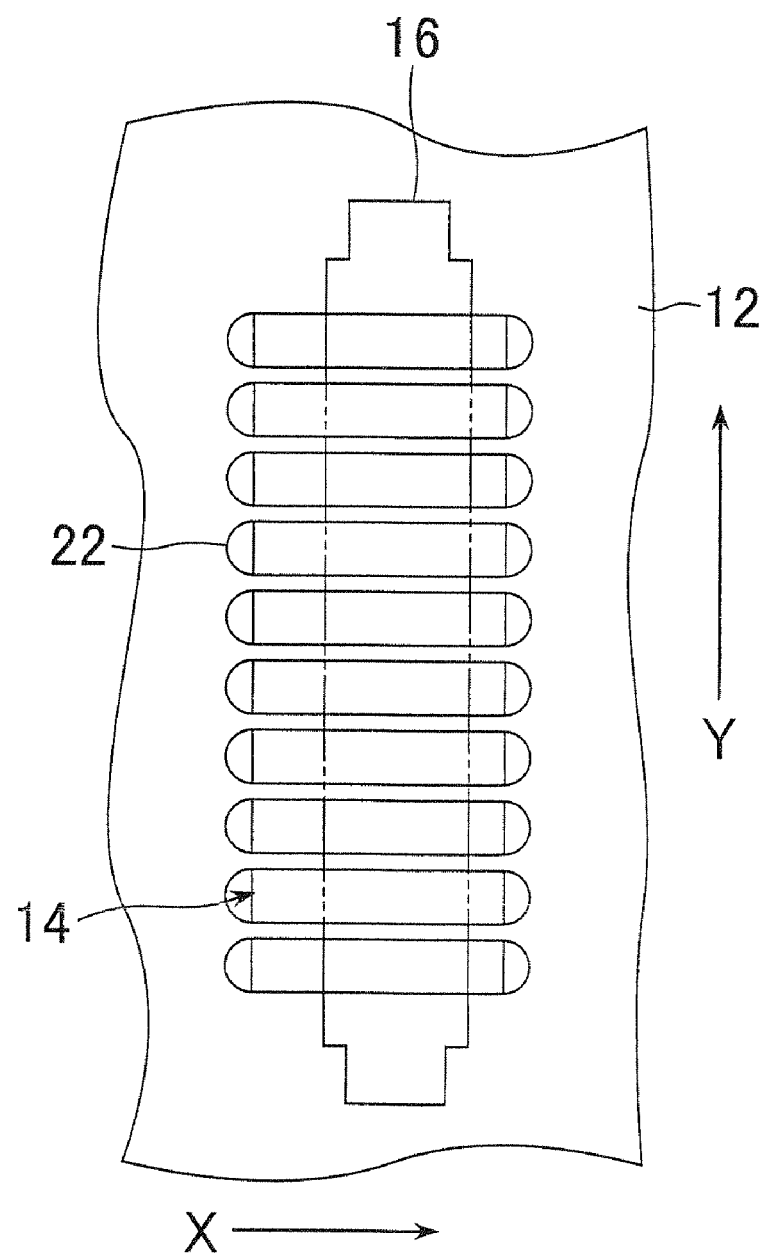
FIG. 3 is a partially enlarged bottom view of the base member showing a row of slots provided therein shown in FIG. 2.

In the example shown in FIG. 2, screw holes 24 for receiving the bolts for fixing the cover member 18 on the base member are formed at each of the four corners of the base member 12. Also, in the example shown in FIG. 2, paired two slots 22 are disposed with the central portion of the base member 12 in-between and at an interval in the horizontal (X) direction, and each pair of the slots 22 are disposed so as to align with each other in the vertical (Y) direction. As is clear from FIG. 3 which shows the planar shape of the slots 22 in an enlarged state, each slot 22 has a rectangular planar shape with the horizontal (X) direction as the longitudinal direction and each corner portion is rounded. The contacts 14 are disposed in respective slots 22, and in order to give elastic biasing force to the contacts 14, the elastic member 16 is disposed along the width direction (Y-axial direction) of the slots 22 so as to traverse the row of the slots 22 aligned mutually in the vertical (Y) direction.

Referring to FIG. 1 again, a rectangular opening portion 18a for receiving a semiconductor IC 20 is formed in a cover 18. The rectangular opening portion 18a is formed to penetrate the cover member 18 in the thickness direction and to permit the upper end of each slot to be exposed partially on the upper face 12a of the base member 12. In the illustration, in order to enable smooth insertion of the semiconductor IC 20 into the rectangular opening portion 18a, each peripheral wall surface portion 26 of the opening portion is constituted by an inclined plane so that the rectangular opening portion 18a may expand upward.

Figure 4:
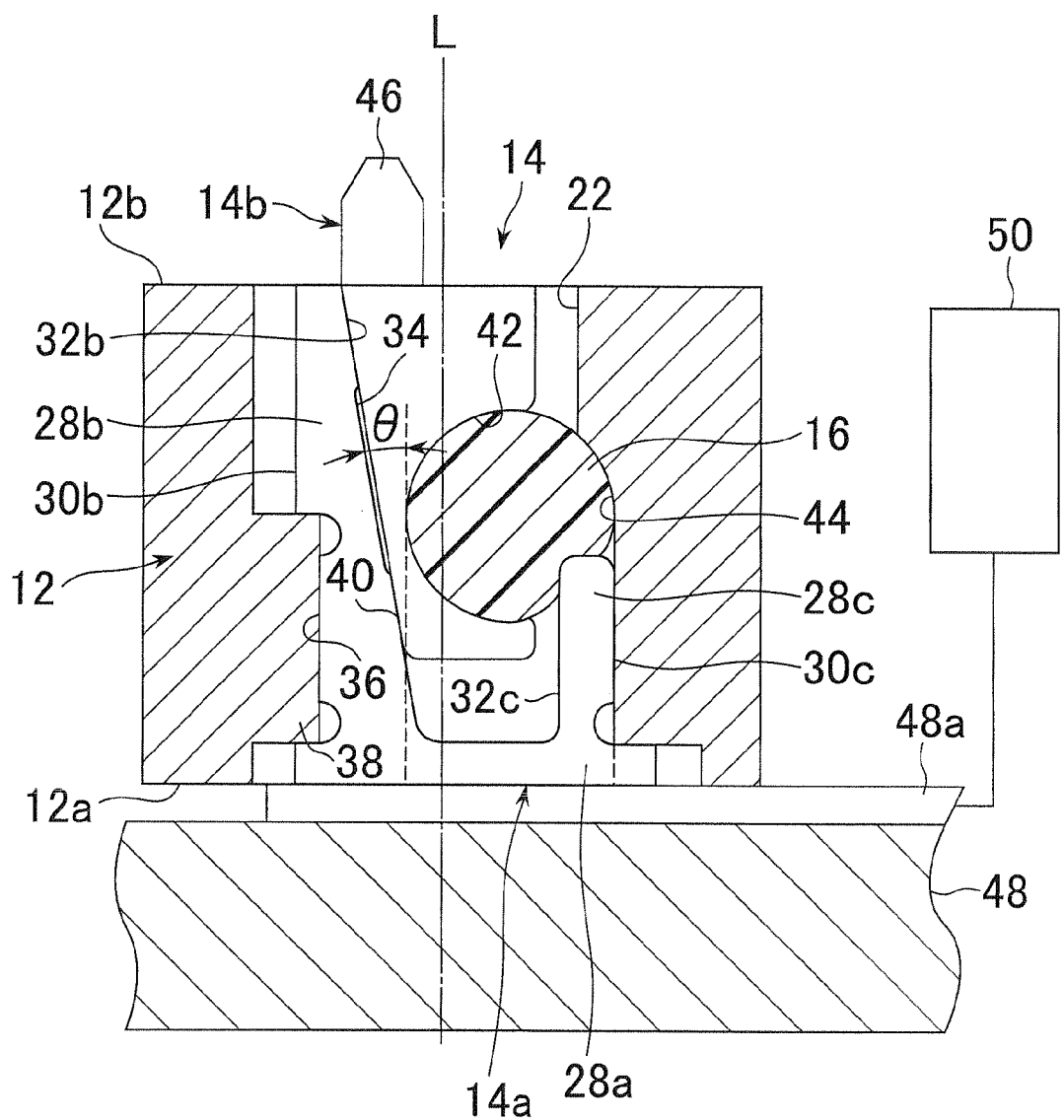
FIG. 4 is a section with a cross section in FIG. 1 partially enlarged.
Figure 5:
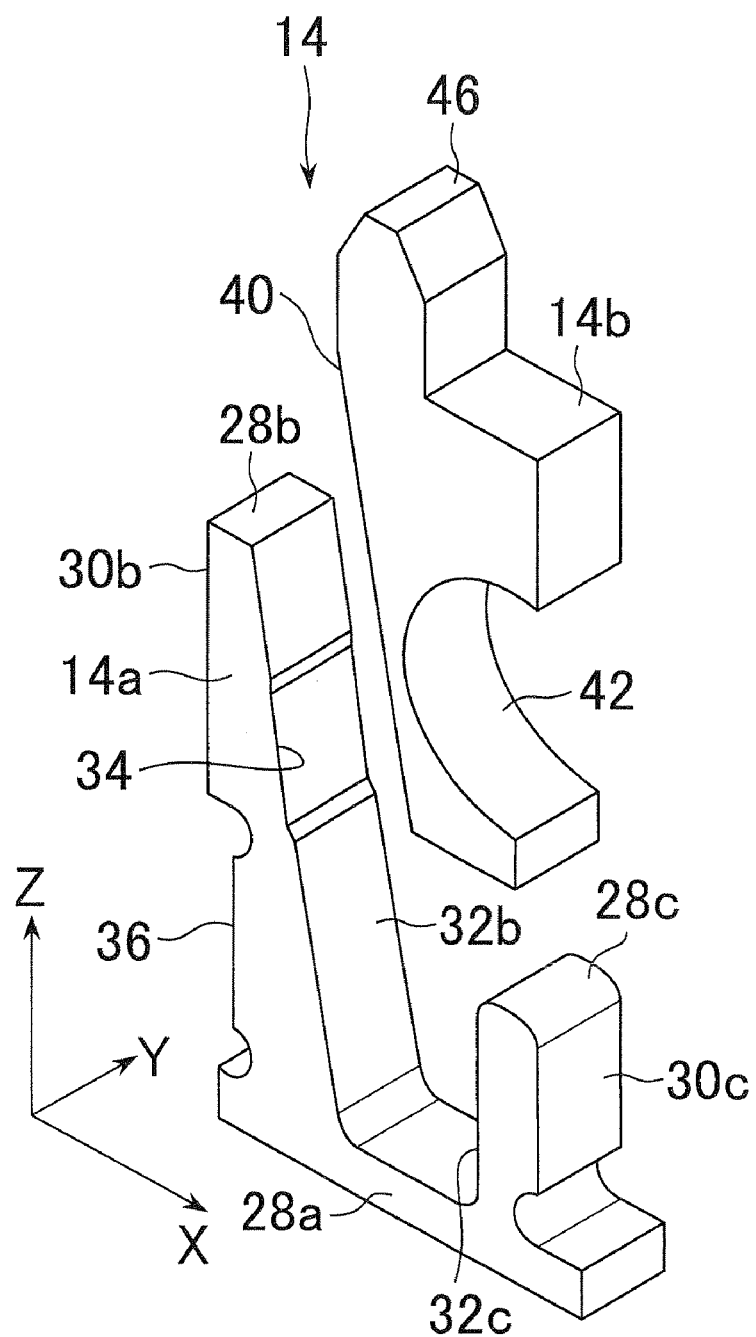
FIG. 5 is a perspective view showing the contact in FIG. 4 in an exploded state.

As shown in FIGS. 4 and 5, the contact 14 disposed in each slot 22 has a fixed piece 14a and the movable piece 14b to be slidably held on the fixed piece. Each of the pieces 14a and 14b can be made of a metal such as a nickel alloy, tungsten or beryllium, or a precious metal such as palladium.

As shown in FIG. 4, the fixed piece 14a has a bottom portion 28a extending in the longitudinal (X-axial) direction of the slot 22 by conforming the underside to the bottom face 12a of the base member 12 within the slot 22; a first upright portion 28b rising from the bottom portion along one corner portion of the slot 22 toward the upper face 12b of the base member 12; and a second upright portion 28c rising from the bottom portion 28a along the other corner portion of the slot 22 at an interval from the first upright portion 28b along the first upright portion.

As shown in FIG. 1, in the pairing slots 22, 22 arranged at an interval from each other in the X-axial direction, each fixed piece 14a is disposed such that the first upright portion 28b is located on the inner corner side for both slots 22 to approach each other, and a second upright portion 28c is located on the outer corner side. Each first upright portion 28b and each second upright portion 28c extend along a center line L of the slot 22 from the bottom 28a at right angles to the bottom portion. The second upright portion 28c terminates approximately at an intermediate height position of the slot 22, as shown in FIG. 4. On the other hand, the first upright portion 28b extends over the intermediate height position of the slot 22 and terminates at an upper end face subsequently coinciding with the upper face 12b.

Both outer faces 30b and 30c, respectively, of the first upright portion 28b and the second upright portion 28c are upright planes parallel to the center line L of the slot 22. Also, the inner face 32c of the second upright portion 28c, confronting the first upright portion 28b, is an upright plane parallel to the center line L of the slot 22. On the other hand, the inner face 32b of the first upright portion 28b, facing the second upright portion 28c, is a straight inclined guide face having a depression angle θ with respect to the center line L of the slot 22 from the bottom face 12a of the base member 12 toward the upper face 12b. This angle θ is preferably within a range of several degrees to about 30°, as mentioned later.

Substantially at the intermediate height position of the straight inclined face 32b, as shown in FIGS. 4 and 5, a shallow groove 34 for reduction of friction with the movable piece 14b as mentioned later is formed along the Y-axial direction. Also on the outer face 30b of the first upright portion 28b of each fixed piece 14a, a recess 36 is formed on the outer face 30b, and on the peripheral wall in one corner portion corresponding to the slot 22, a projection 38 (see FIG. 4) engageable with the recess 36 is formed.

The fixed piece 14a of each contact 14 is, for example, pushed from the front end of the first upright portion 28b into the corresponding slot 22 from the bottom face 12a of the base member 12 so as to avoid the projection 38, with the tip of the first upright portion 28b warped slightly toward the second upright portion 28c, thereby engaging the projection 38 and the recess 36. By the engaging mechanism having this projection 38 and the recess 36, each fixed piece 14a is engaged at a predetermined position of the corresponding slot 22.

The movable piece 14b has an inclined face 40 slidably abutting the straight inclined guide face 32b between the first upright portion 28b and the second upright portion 28c, and an arc-shaped fitting curved face 42 formed on the side opposite to the inclined face. The fitting curved face 42 of each movable piece 14b disposed within each slot 22 sandwiches the elastic member 16 in a partially compressed state in cooperation with the top of the second upright portion 28c of each fixed piece 14a disposed within each slot, as shown in FIG. 4, and the fitting portion 44 formed at the other corner portion of the slot 22. By the elastic biasing force of the sandwiched elastic member 16, the movable piece 14b receives spring force upward of the inclined face, with the inclined face 40 of the movable piece 14b along the straight inclined face 32b of the fixed piece 14a, such that the projected portion 46 formed on the top of the movable piece projects from the upper face 12b of the base member 12.

The movable piece 14b can be assembled into the fixed piece 14a by pushing the bottom portion on the side opposite to the projected portion 46, for example, with the elastic member 16 sandwiched between the fitting portion 44 formed on the peripheral wall of the slot 22 of the base member 12 and the second upright portion 28c of the fixed piece 14a engaged with the base member 12, such that the movable piece 14b receives the elastic member 16 on the fitting curved face 42. Thus, when the contact 14 is assembled into each slot 22, the wiring base plate 48 is disposed on the bottom face 12a of the base member 12, as shown in FIG. 4. On one face of the wiring base plate 48, a plurality of wiring portions 48a to be electrically connected to the tester 50 are formed, and the wiring base plate 48 is fixed at the base member 12 by means of bolts (not shown), so that each wiring portion 48a contacts the underside of the bottom portion 28a of the fixed piece 14a to which each wiring portion 48a corresponds. This completes assembling of the electrical connection apparatus.

Figure 6:
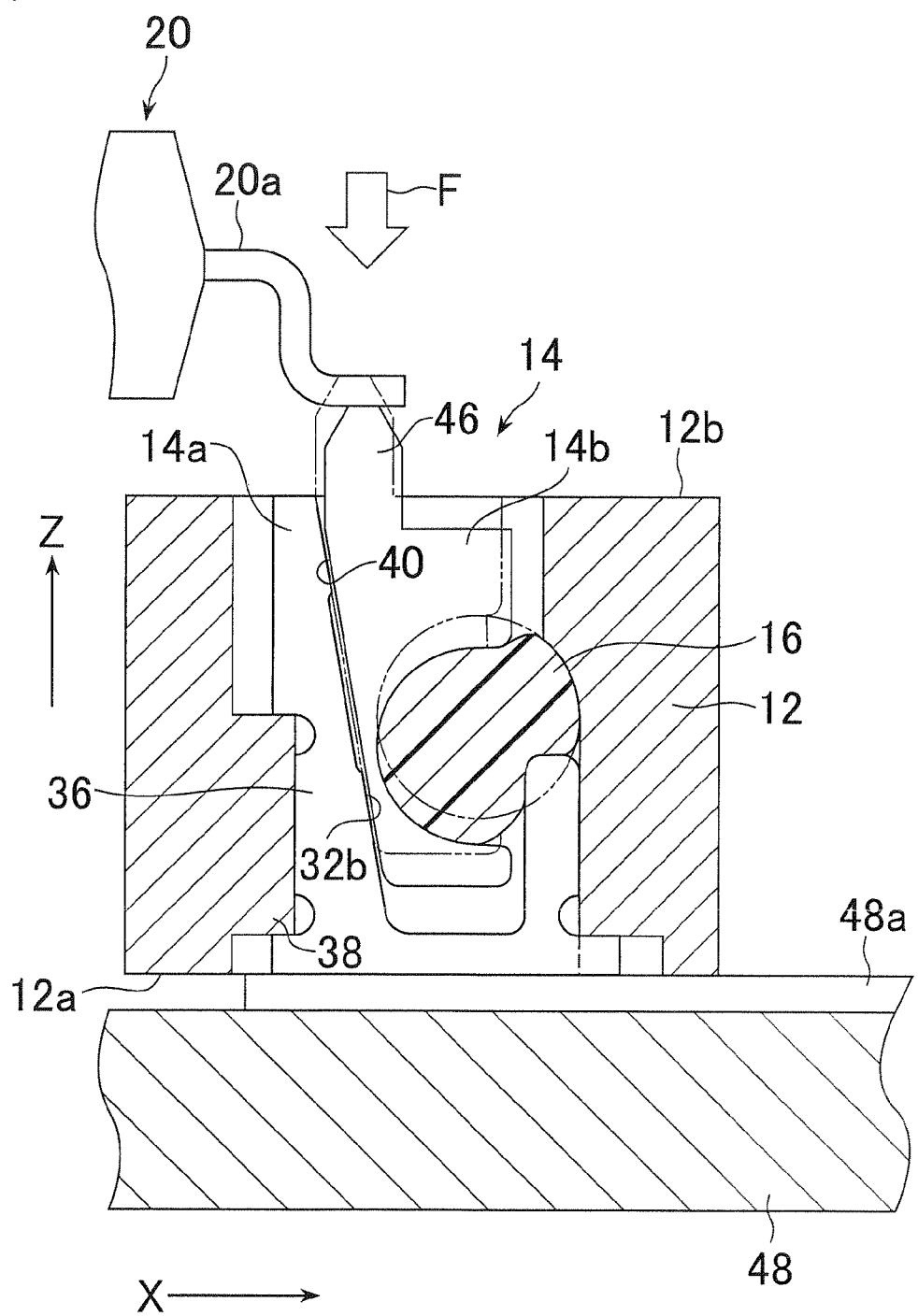
FIG. 6 is a view similar to FIG. 4 showing the electrical connecting apparatus in a testing state.

As shown in FIG. 1, in the assembled electrical connecting apparatus 10, the semiconductor IC 20 is dropped into the opening portion 18a of the cover member 18. As shown in FIG. 6, when the lead 20a of the semiconductor IC 20 abuts the projected portion 46 in the movable piece 14b of the contact 14 corresponding thereto, external force F is applied to the semiconductor IC 20 in this state of abutment, and this external force F, surpassing the elastic biasing force of the elastic member 16, causes the projected portion 46 of the movable piece 14b to be pushed down as a whole in the plate thickness direction (Z-axial direction) of the base member 12 toward the position indicated by the solid line from the position indicated by the broken line in the drawing. At this time, the movable piece 14b, as it slides on the straight inclined guide face 32b of the fixed piece 14a on which the inclined face 40 abuts, slightly displaces in the X-axial direction according to the angle of inclination θ of the inclined guide face due to the guiding action of the straight inclined guide face. Because of the X-axial displacement following the displacement in the Z-axial direction of the movable piece 14b, the projected portion 46 of the movable piece 14b scrapes away the oxide film of the contact face of the lead 20a of the semiconductor IC 20, thereby surely preventing the intervention of the oxide film for contact with the lead 20a.

Also, the contact between the lead 20a and the projected portion 46 is made under the elastic biasing force of the elastic member 16, and part of the elastic biasing force acts as contact pressure between the inclined face 40 of the movable piece 14b and the straight inclined guide face 32b of the fixed piece 14a, so that each lead 20a is connected to the wiring portion 48a connected to the fixed piece through the movable piece 14b of the corresponding contact 14. As a result, each lead 20a of the semiconductor IC20 is surely connected to the tester 50.

Moreover, since the fixed piece 14a of each contact 14 is surely fixed within the corresponding slot 22 by the engaging mechanisms 36, 38 respectively, even if the movable piece 14b slides on the straight inclined guide face 32b of the fixed piece 14a, movement of the fixed piece 14a by the elastic biasing force of the elastic member 16 is surely prevented. Consequently, abrasion of the fixed piece 14a and the wiring portion 48a of the wiring base plate 48 by their relative motion can be prevented, so that lowering in durability due to the abrasion can be prevented.

Thus, according to the electrical connecting apparatus 10 of the present invention, since abrasion of the fixed piece 14a and the wiring portion 48a of the wiring base plate 48 due to their relative motion can be prevented, thereby improving the durability.

Also, when the front end of the projected portion 46 of the movable piece 14b is projected from inside the slot 22 at the contact position with the lead 20a of the semiconductor IC 20, surer electrical connection between the lead 20a, i.e., the electrode of the semiconductor IC 20, which is a device under test, and the contact 14 is enabled.

Various engaging mechanisms can be adopted for coupling the fixed piece 14a and the base member 12. By use of the engaging mechanisms 36, 38 as mentioned above, however, the fixed piece 14a can be surely and easily coupled with the base member 12 fixedly.

As regards sliding of the movable piece 14b along the straight inclined guide face 32b of the fixed piece 14a, the rate of the displacement amount of the Z-axial component and the displacement amount of the X-axial component of the movable piece 14b varies by the inclination angle θ. The nearer the value of θ to zero, the rate of the former to the latter becomes greater. As the amount of displacement of the X-axial component increases, it is feared that, when the electrode 20a of the device under test 20 is pressed against the movable piece 14b of the corresponding contact 14, the projected portion 46 of the movable piece might be extruded from the corresponding electrode 20a. In a miniaturized semiconductor device provided with a smaller electrode, too, it is preferable to determine the inclination angle θ within a range of several degrees to about 30° as mentioned above for surely preventing the movable piece 14b from deviating from the electrode 20a of the projected portion 46 and for ensuring the action to remove the oxide film. Thus, the present invention can be applied to an electrical test of an IC semiconductor wafer with IC circuits collectively formed.

Also, while the straight inclined guide face 32b can be an arc-like curved face, it is preferable to constitute it a straight guide face as mentioned above, for accuracy in machining of the guide face and for enabling more accurate control of the displacement amount of the X-axial component to the displacement amount of the Z-axial component of the movable piece 14b.

By providing the fixed piece 14a with the first and second upright portions 28b, 28c, forming the guide face 32b of the movable piece 14b in relation to the first upright portion 28b, and disposing the elastic member 16 in relation to both upright portions 28b, 28c, compact contacts 14 having a relatively simple constitution and the electrical connecting apparatus 10 having the contacts can be materialized.

By disposing a single elastic member 16 at each row of the slots 22, so as to cross the row of the slots, elastic biasing force favorable for action of plural contacts can be given so that a favorable electrical connection can be obtained by the elastic biasing force of the single elastic member 16. Consequently, there is no need for two elastic bodies in each row of slots as heretofore, thereby simplifying the constitution.

Figure 7:
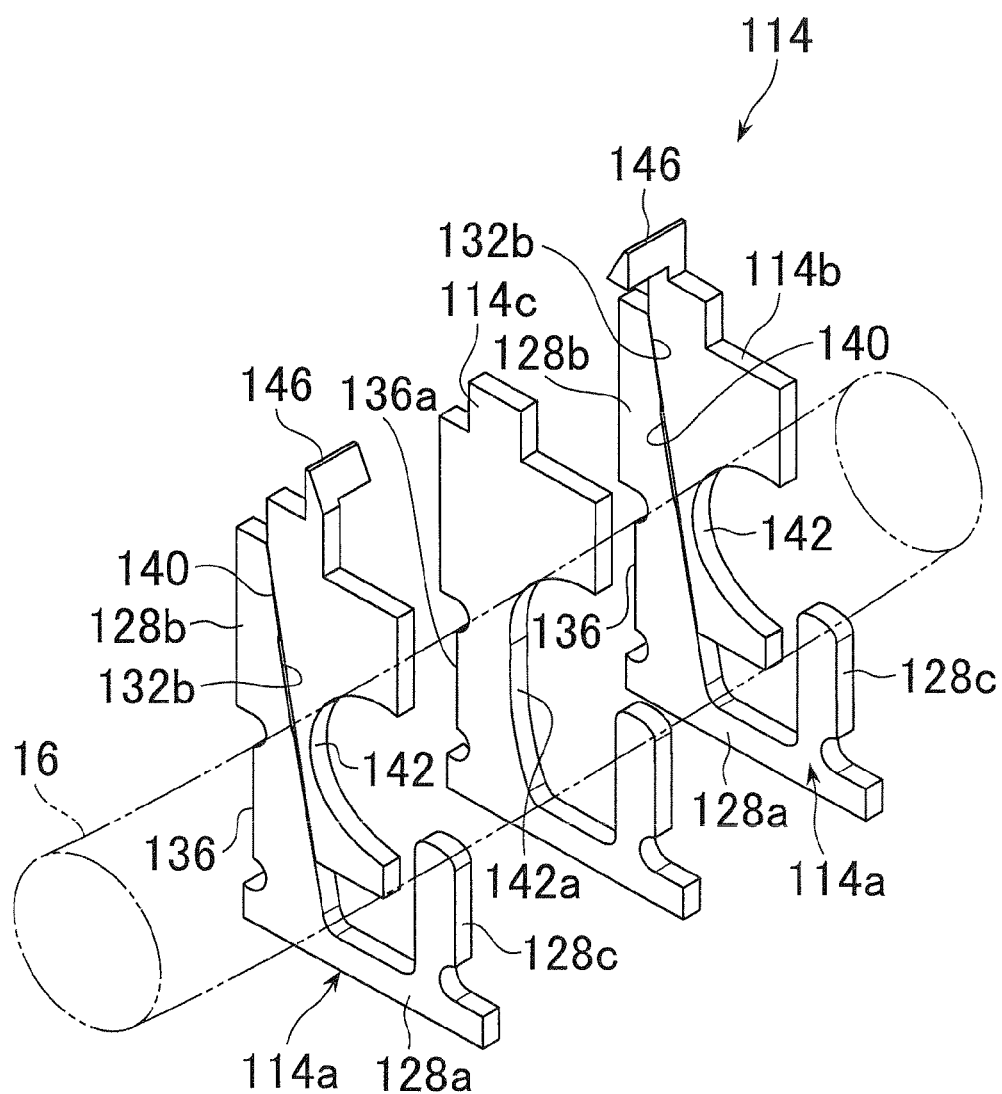
FIG. 7 is a perspective view showing a Kelvin connector contact in an exploded state.
Figure 8:
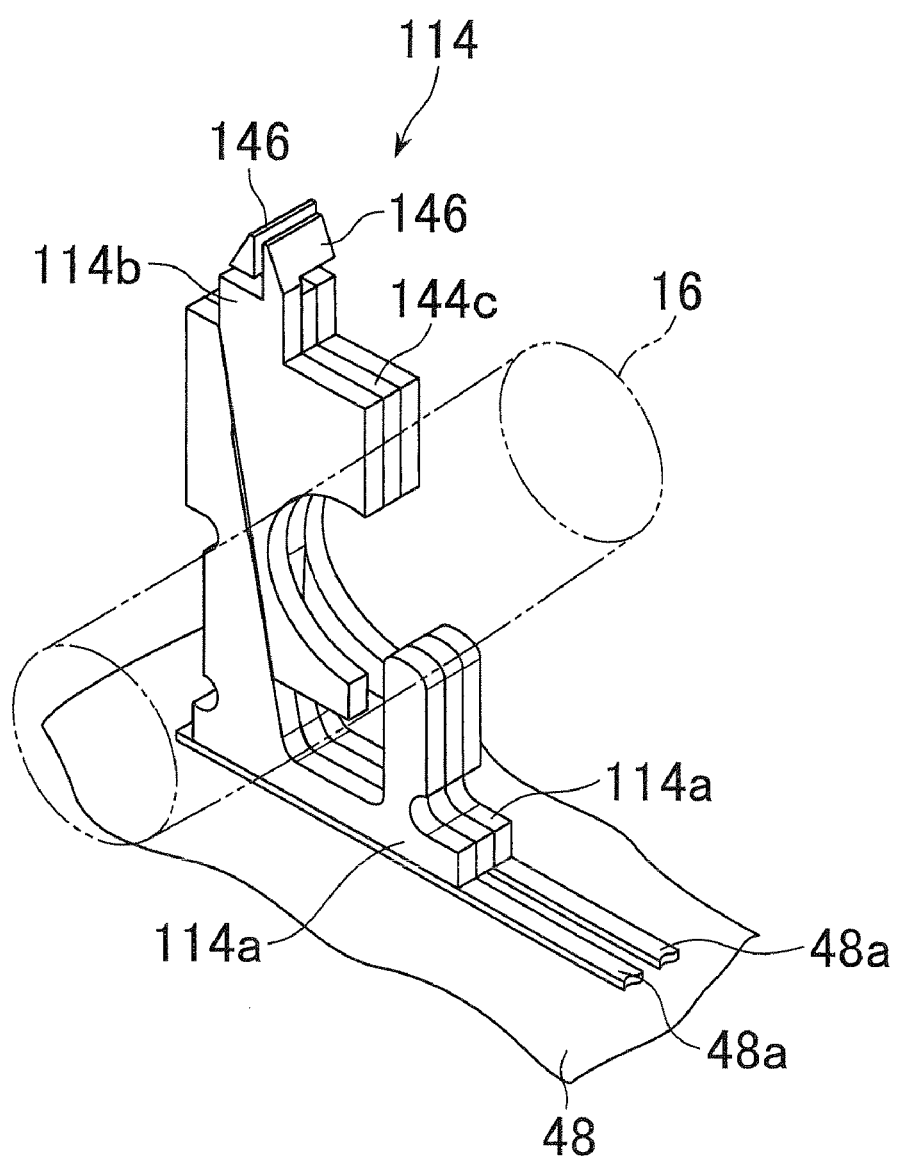
FIG. 8 is a perspective view of the Kelvin connector contact.

FIGS. 7 and 8 show examples of using a Kelvin connector contact 114 as the contact 14. The Kelvin connector contact is, as has been well known, formed from a laminated structure with an insulator interposed between a pair of conductive plates spaced apart from each other. Consequently, also in the Kelvin connector contact 114 according to the present invention, its fixed piece and movable piece are composed of a pair of conductive plates 114a and 114b joined to each other with an insulating plate 114c interposed therebetween.

Each conductive plate 114a for the fixed piece has a first upright portion 128b including a recess 136 and a straight inclined guide face 132b of an engaging mechanism such as one mentioned above, a second upright portion 128c shorter than the upright portion 128b, and a bottom portion 128a for coupling both the upright portions. Also, each conductive plate 114b for the movable piece has an inclined face 140 opposite to the straight inclined guide face 132b, a fitting curved face 142 for receiving the elastic member 16, and a projected portion 146.

Both conductive plate 114a for the fixed piece are joined through the insulating plate 114c to be interposed therebetween so as to prevent both conductive plates from short-circuiting. In this insulating plate 114c, the recess 136a which fits the recess 136 of the conductive plate 114a and a fitting curved face 142a receiving the elastic member 16 are formed. Both conductive plates 114b for the movable piece are assembled into the slots 22 of the base member 12 like the above-mentioned one (not shown) on both sides of the insulating plate 114c in a state that mutual short-circuiting is prevented by the insulating plate, that the elastic member 16 is received in the fitting curved face 142, and that each inclined face 140 is brought into contact with the corresponding straight inclined guide face 132b.

Also, as shown in FIG. 8, a pair of wiring portions 48a are formed in the wiring base plate 48 to correspond to each conductive plate 114a of the fixed piece of the contact 114, and each wiring portion 48a is connected to the corresponding conductive plate 114a.

According to this Kelvin connector contact 114, as is well known heretofore, two wiring portions 48a can be drawn out from one lead 20a, thereby enabling the Kelvin connection in which a voltage applying route and a voltage detecting route are separated, and even a low resistance value of the device under test 20 can be measured at high accuracy by reducing influence by contact resistance of the contacts.

Also, according to the Kelvin connector contact 114 in the present invention, likewise in the case of the contact 14, each conductive plate 114a of the fixed piece is fixedly held by the base member 12, so that each conductive plate 114a does not slide on the wiring portion 48a at each testing of the semiconductor IC 20, so that no abrasion by sliding is caused, thereby improving the durability.

INDUSTRIAL APPLICABILITY

The present invention is not limited to the above embodiments, but can be varied without departing from its purport.

I claim:

1. An electrical connecting apparatus for connecting electrodes of a device under test to an electric circuit of a tester, comprising:
    an electrically insulating plate-like base member for receiving said device under test and having a top face, a bottom face and a plurality of slots penetrating through the base member between the top face and the bottom face;
    contacts disposed within said slots so as to contact said electrodes of said device under test positioned on said base member and for connecting said electrodes to the electric circuit of said tester; and
    an elastic member;
    wherein each contact includes: a fixed piece mounted on said base member within said slot for connection with said electric circuit; and a movable piece disposed within and extending out of the top surface of said slot and electrically contacting said fixed piece,
    said fixed piece having a guide face arranged for guiding said movable piece toward a contact position in which said movable piece is positioned for contacting an electrode of said device under test while still maintaining electrical contact with the fixed piece; and
    wherein said movable piece is supported by said elastic member and slidably positioned on said guide face so as to receive elastic biasing force of said elastic member toward said contact position; and
    further wherein said fixed piece has a substantially flat bottom surface to conform to said bottom face of said base member within the slot so as to provide a constant connection with said electric circuit without extending out of the bottom surface of the base member.

2. An electrical connecting apparatus according to claim 1, wherein a wiring base plate is fixed on one face of said base member, wherein said base member receives said device under test on the other face thereof; wherein said wiring base plate has a wiring portion to be connected to said electric circuit of said tester and for said fixed piece to contact, and through said wiring portion, said fixed piece is electrically connected to said electric circuit.

3. An electrical connecting apparatus according to claim 2, wherein said movable piece has a projected portion capable of projecting from within said slot beyond the other face of said base member; and wherein the tip of said projected portion projecting from within said slot at the contact position comes in contact with said electrode.

4. An electrical connecting apparatus according to claim 1, wherein said fixed piece is engaged with the peripheral wall of said slot of said base member by an engaging mechanism.

5. An electrical connecting apparatus according to claim 4, wherein said engaging mechanism has a projection formed in said peripheral wall of said slot, and a recess formed in said fixed piece for engagement with said projection.

6. An electrical connecting apparatus according to claim 1, wherein said guide face is formed angularly with respect to a center line penetrating both end openings of said slot, so as to impart both lateral and vertical movement relative to the centerline when said movable piece slides along said guide face.

7. An electrical connecting apparatus according to claim 6, wherein said guide face is a straight guide face extending angularly with respect to said center line of said slot.

8. An electrical connecting apparatus according to claim 7, wherein said fixed piece has a bottom portion disposed along one face of said base member within said slot and along the longitudinal direction of said slot;
    a first upright portion rising from one corner portion of said bottom portion along the longitudinal direction of said slot toward the other face of said base member along the wall face of said slot; and
    a second upright portion rising from the other corner portion of said bottom portion along said first upright portion at an interval to said first upright portion; wherein said guide face is formed on the face of said first upright portion confronting said second upright portion; and
    wherein said movable piece receives elastic biasing force of said elastic member between both said upright portions so as to come in contact with said guide face.

9. An electrically connecting apparatus according to claim 1, wherein said plural slots are aligned in their width direction, wherein in each of said contacts said movable piece and fixed piece are aligned within each of said slots, and wherein said single elastic member is disposed across said aligned slots in the width direction of said slots so as to apply said elastic biasing force to each movable piece within said plural aligned slots.

10. An electrical connecting apparatus according to claim 1, wherein said contact is a Kelvin connector contact made of a laminated structure including a pair of conductive layers and an electrically insulating layer interposed between said conductive layers.

11. A method of interfacing a semiconductor device-under-test (DUT) to an electric circuit of a tester device, the method comprising the steps of:

providing a contact for establishing a temporary electrical connection between a lead of the DUT and the electric circuit of the tester device, the contact comprising a fixed part and a movable part;

establishing electrical contact between the fixed part and the electric circuit of the tester device;

mounting the movable part for sliding engagement along a guide surface of the fixed part, said sliding engagement providing continuous electrical contact between the fixed part and moving part, while permitting movement of the movable part relative to the fixed part;

biasing the movable part toward a standby position;

moving a lead of the DUT into mechanical and electrical contact with the movable part so that the lead displaces the movable part, characterized by a sliding action of the movable part along the guide surface of the fixed part, from the standby position into a testing position;

wherein the movable part is displaced laterally in moving from the standby position to the testing position so as to scrape a surface of the DUT lead where the movable part contacts the DUT lead, thereby improving electrical conductivity with the lead without displacing the fixed part that provides electrical contact with the electric circuit of the tester device; and further comprising providing a rigid, substantially planar base member formed of an insulating material;

forming a slot extending through the base member between a top surface and a bottom surface:

positioning the contact in the slot with the movable part extending out of the top surface for contacting the DUT; and providing a substantially flat bottom surface on the fixed part, arranged co-planar with the bottom surface of the base member, for electrical contact with the electric circuit of the tester device without extended out of the bottom surface of the base member.

12. A method according to claim 11 wherein said biasing step includes providing an elastic member in contact with the movable part.

13. A method according to claim 12 wherein both the fixed part and the movable part are formed of metal.

14. A method according to claim 12 wherein the fixed part is mounted in a predetermined position in both mechanical and electrical contact with the electric circuit of the tester device, so that movement of the movable part does not wear or abrade the electrical circuit contacts.

15. A method according to claim 11 including:

providing a plurality of contacts for establishing corresponding temporary electrical connections between respective leads of the DUT and the electric circuit of the tester device, each contact comprising a fixed part and a movable part; and wherein said biasing of the moveable parts comprises providing a single elastic member and disposing the elastic member across all of the contacts so as to bias the movable parts of all of the contacts.

16. A method according to claim 11 including:

providing an elastic member for biasing the movable part toward the standby position, the elastic member having a generally round cross-section; and forming a recess in the movable part sized and arranged for receiving the elastic member for operatively biasing the position of the movable member.

17. A method according to claim 11 including:

arranging the elastic member in the slot for retaining the movable part substantially within the slot.

18. A method according to claim 17 including arranging the fixed part so as to retain the movable part substantially within the slot.

19. A method according to claim 18 including removably engaging the fixed part within the rigid base member so as to retain the movable part substantially within the slot.

* * * * *